United States Patent [19]
Compton

[11] 4,016,595
[45] Apr. 5, 1977

[54] FIELD EFFECT TRANSISTOR SWITCHING CIRCUIT

[75] Inventor: James B. Compton, Cupertino, Calif.

[73] Assignee: National Semiconductor Corporation, Santa Clara, Calif.

[22] Filed: Sept. 2, 1975

[21] Appl. No.: 609,443

Related U.S. Application Data

[62] Division of Ser. No. 474,004, May 28, 1974, Pat. No. 3,916,222.

[52] U.S. Cl. .................................. 357/43; 357/46; 357/86
[51] Int. Cl.² ........................................ H01L 27/02
[58] Field of Search .................... 357/43, 46, 86

[56] References Cited
UNITED STATES PATENTS 3,703,650  11/1972  Kendall ............................. 357/43
3,778,688  12/1973  Crawford .......................... 357/43

Primary Examiner—Edward J. Wojciechowicz
Attorney, Agent, or Firm—Gail W. Woodward; Willis E. Higgins

[57] ABSTRACT

A novel FET switching circuit including a high beta transistor in an analog switch FET circuit for rapid, low power consumption with transient current pull up to the FET switching circuit to the on condition. A novel circuit is utilized and coupled to the transistor for the derivation of a reference voltage for the turn off of the analog switch FET. A novel transistor - JFET nonsaturating switching circuit which gives high speed turn off is incorporated.

1 Claim, 3 Drawing Figures

U.S. Patent
April 5, 1977
4,016,595
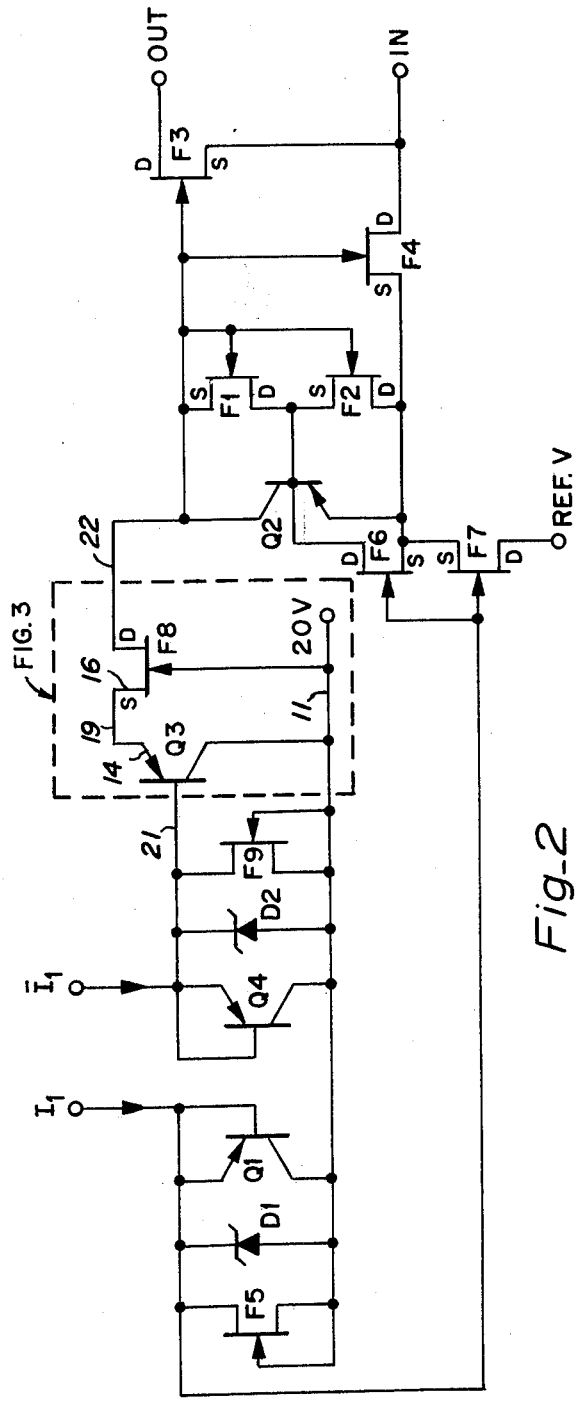
Fig.-3
Fig.-2
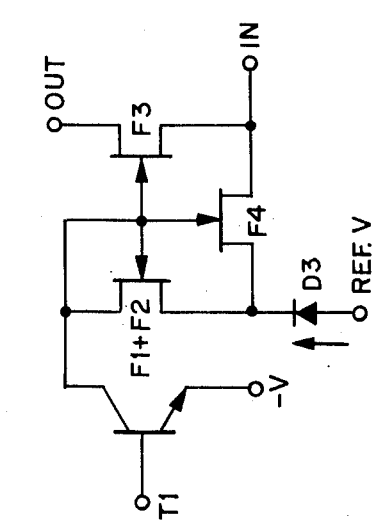
Fig.-1 PRIOR ART

FIELD EFFECT TRANSISTOR SWITCHING CIRCUIT

This is a division of application Ser. No. 474,004, filed 5/28/74, now U.S. Pat. No. 3,916,222.

BACKGROUND OF THE PRESENT INVENTION

To turn off a known form of FET switching circuit of the type shown as prior art in FIG. 1 it is necessary to pull the gate down to a negative voltage, i.e., one equal to the most negative signal on the source or the analog rail on the input IN plus the pinch off voltage, — (V + Vp). One of the FETs is shown as a combination FET F1 + F2 to show the relationship of the known prior art switching circuit to the present invention.

One fundamental problem with this known form of switching circuit comprising FET F3 across the analog input rail IN and the output terminal OUT, FET F4 and FET F1 + FET F2 is that when the current is pulled down, i.e., when the switch is turned off and the gate pulled down to a negative voltage, the sum of F1 and F2 draws current and takes amounts of power. This results from the fact that it is necessary to create a voltage drop equal to or greater than the pinch off voltage across F1 and F2. It would be desirable to reduce the power consumption when F3 is in the off state.

In addition, the normal manner of turning off such a FET switching circuit is with a bipolar transistor T1 coupled to the negative supply. However, in driving current into the base of such a transistor, it stores charge in the base which results in a delay time in the turn off of the switching circuit.

In order to turn the switch FET F3 on, i.e., to get the gate to come from a negative voltage up to the analog signal voltage on the analog signal rail IN very rapidly, it is necessary to draw large values of current through the sum of FETs F1, F2 and F4.

With such a circuit, it is a problem to get from the off to the one state very rapidly and yet not dissipate power in the off state of the switching circuit. Therefore, it is necessary to have a high transient current through the leg of the circuit F1, F2 and F4 and a need to discharge the capacitance on the gate of FET F3 very rapidly.

SUMMARY OF THE PRESENT INVENTION

The present invention provides a high speed, low current turn on and turn off of analog switches utilizing FET switching circuits.

One feature of the present invention is the use of a novel FET turn off circuit including a transistor-JFET combination which gives a very high speed turn off due to its nonsaturating characteristics.

Another novel feature of the present invention is the utilization of a super beta transistor for rapid, low power consumption with transient current to pull up the FET switch circuit to the on condition.

As an additional feature a novel circuit is utilized for the derivation of a reference voltage for the turn off of the analog switch FET circuit by the use of a novel FET circuit arrangement using the matched characteristics of simultaneously fabricated devices.

BRIEF DESCRIPTION OF THE DRAWINGS

FIG. 1 is a schematic diagram of a known typical form of FET switching circuit utilizing a transistor switch turn off and also utilizing a diode for decoupling a reference voltage source circuit from the switching circuit.

FIG. 2 is a schematic diagram of the novel FET switching circuit of the present invention.

FIG. 3 is a cross-sectional view of the structure of a combination transistor and FET as employed in the present invention.

DESCRIPTION OF THE PREFERRED EMBODIMENTS

Referring now to FIG. 2, in turning off the FET switching circuit including the FET F3, a current I1 flows into the circuit comprising transistor Q1, FET F5 and diode D1; at this time there is no current $\overline{I1}$ flowing. The voltage across the Zener diode D1 is about 5.9 volts which is a typical value and the punch through voltage of the transistor Q1 is approximately between 4 and 7 volts; it might be either greater or less than the breakdown voltage of D1. With Idss, the static drain current of F5, the current limiting of F5 is approximately 400 microamperes. Therefore, an input signal that is greater than 400 microamperes produces a voltage across Q1 between 4 and 5.9 volts and, with a − V supply voltage of − 20 volts, gives a −15 to − 14.1 volts on the gates of FETs F6 and F7. Now the voltage at the gate of F3 will be about −19.5 volts because $\overline{I1}$ equals 0; therefore the base of Q3 goes to −20 volts through the resistance of F9 which reduces the emitter voltage of Q3 to −19.5 volts resulting in the turn-On of F8 to a low resistance. The limiting current through F1 is approximately 100 microamperes; therefore the current through F7 is approximately 100 microamperes and this same 100 microamperes also flows through F6. The current through F2 is very close to 0 and the current through Q2 is 0 since the $V_{BE}$ is <0.3V. These voltages put the FET switch F3 in an off condition for any voltage on the analog rail IN from − 13 volts to at least + 15 volts because the only limitation on the positive voltage is the breakdown voltage of the field effect transistor. In this condition, therefore, the switching circuit comprising the FET circuit F3 has been turned off.

With reference to the operation of the circuit to turn the FET switch on, the current flows through $\overline{I1}$ rather than I1 and the base of Q4, which during the turn off period was at − 20 volts, will now go to − 16 to − 14.1 volts because of the actions of transistor Q4, diode D2 and FET F9 (which are similar in action to Q1, D1, and F5), turning off Q3 and F8. At the same time the base of Q1 will be at − 20 volts and this means that the gate voltage at F7 will be a − 20. With the pinch off voltages of the FETS less than 6.5 volts, with a − 16 to − 14.1 volts on the source of F7, the current through F7 goes to approximately 0 microamps. Because the gate was moved negative (− 20) with respect to the source of F7 (− 16), F7 is turned off. The gate of F6 is also moved to a − 20 volts with respect to the source of F6 which is at − 16 to − 14.1 volts and therefore F6 is turned off. At this point the source of F6 is floating as well as the source of F7 and these have both been disconnected so that F6 and F7 are out of the circuit. There is still approximately a voltage of − 15 to − 13 existing at the base of Q2 due to the capacitance storage of this node and also a voltage from the drain to source of F1 between 3.5 to 6.5 volts. Therefore F2 is off at this instant in time when the inputs are reversed. Now the total current, 100 microamperes for example, through F1 flows into the base of Q2 from the total charging current, in other words the capacitive current existing along the buss on the gate of F3, the gate of F4, the gate of F2, the collector of Q2, and the drain of F8. All of that charging current now flows as a discharge current into the collector of Q2 and drain of F1. Now with the 100 microamperes base current through F1, the beta of 500 of Q2 gives a current into the collector of Q2 approximately 50 milliamperes. Thus, a very small current into the base, i.e., 100 microamperes, becomes 50 milliamperes into the collector of Q2, and Q2 turns on very hard.

It is noted that there is no current flowing down into F8 since the voltage at the base of Q3 is − 14.1 to − 16 volts and therefore the voltage at the emitter of Q3 is − 13.5 to − 15.4 volts. It is noted that the source voltage is definitely greater than the 2 to 5.5 volt pinch off voltage on the field effect transistor and therefore F8 is off. The minimum pinch off voltage of F8 is greater than the 0.6 volt drop of Q3 from emitter to collector in the on condition. Now the only current which can flow from the gate of F3, the drain of F8, or along the buss between these points is through the collector of Q2 or through F1. Therefore, this total current flows through Q2 with a very small percentage through F1. This current flows through F4 to the input node (IN) actually closing the loop back through the source of F3. What is actually occurring is a discharging of the capacitance from the gate to source of F3. With this low resistance path from the gate to source of F3, F3 is turned on when the gate to source voltage of F3 becomes less than its pinch off voltage. It is important to note in this circuit that Q2 gives a very high multiplication of the discharging current, in this case the current through F1, in order to make the discharge of the capacitive loop through Q2, F4, F3 at a very fast discharge rate, thus providing a very fast turn on for the switching circuit. It is also noted that when this same loop is charging up, in other words, drawing current through F8 to turn off, the presence of F6 in the emitter to base of Q2 results in a very small current to pull it down. In other words, the current through F8 becomes small because there is a FET F6 which takes Q2 out of the picture, i.e., removes Q2 essentially from the circuit.

The purpose of the FET F2 is to provide a resistive path from the gate of F3 through F1, F2 and F4 to the input after the switch F3 is turned almost all the way on. Assuming that the analog rail IN is at 0 volts, when the gate of F3 reaches about − 0.6 volts there is no longer a current flow into the base and therefore Q2 turns off. In order to keep this current flowing, to get the gate of F3 all the way up to the source voltage, F2 is installed in the circuit to insure the transistion all the way to the gate to source voltage of 0 volts on F3.

This novel circuit permits a switching from off to on very rapidly and yet virtually eliminates the dissipation of power in the off state. This accomplishes this result by giving a high transient current through the leg which is essentially F1, F2, and F4 for discharging the capacitance on the gate of F3 very rapidly. Such a function is provided by the addition of Q2 to the circuit. In turning the transistor F3 on, Q2 supplies the large current on a transient basis required to turn F3 on, since F1 drives its total current into the base of the transistor therefore allowing a very large collector-emitter current to flow through Q2, this large transient current also flowing through F4 and pulling the gate of F3 up to the input analog signal rail very rapidly.

Therefore, the transistor Q2, in combination with FETs F1 and F2, represent a substantial improvement over the prior art FET switches. This is because it is now possible to reduce the power consumption when the switching circuit FET F3 is off.

An additional advantage of the present invention is the utilization of FETs F6 and F7 to generate an internal reference voltage for the emitter of Q2. In order to reduce the power when the device is off, i.e., when FET F3 is off, the circuit permits F6 to come on, F6 being shunted directly across F2, and that reduces the emitter base voltage of Q2 to very nearly 0, therefore shutting off Q2.

In order to generate this internal reference voltage in the past circuits such as shown in FIG. 1, a diode D3 was placed in the circuit and an external reference voltage connected thereto. Therefore, when the source of F4 moved above the external reference voltage, the diode D3 disconnected it and, when the source was below the external reference voltage, forward current flowed through the diode. By the use of F6 and F7 to generate the same internal reference voltage the effect of the diode recovery time to delay the turn on of the circuit has been eliminated. With the internal reference voltage source used to drive this switch, i.e., when F6 and F7 are turned on, the voltage from the collector to the emitter of Q2 is equal to or greater than the voltage from the gate of F7 to the negative voltage supply because a current equal to or less than Idss of F7 is present from F1 through Q3 and F8. With this internal reference voltage greater than the pinch off voltage of the FETs, then F3 and F4 will both be off. With the switch F4 open and the switch F3 open, the driver portion of the circuit is totally disconnected from any outputs. Thus, the use of FETs F6 and F7 provides a unique internal voltage reference to the combination of FETs F1, F2 and transistor Q2 used as the pull up of the analog gate.

In turning off the gate F3, the way in common use on almost any junction switch is to simply use a saturated bipolar transistor such as T1 in FIG. 1 to the negative supply. The problem with the bipolar transistor is that when current is driven into its base it stores charge in the base. In order to eliminate this charge of storage in the driver as a delay time in the circuit, the combination of the transistor Q3 and FET F8 is utilized. Therefore, the transistor Q3, which is an emitter follower, is used as the means for driving the source of the FET F8; it is in effect a noninverting transistor with characteristics similar to an NPN transistor. When the base of the transistor Q3 rises by a voltage Vp above the negative supply voltage, then its emitter is at a Vp plus the emitter base drop of the transistor $V_{BE}$, which will shut off F8. Thus by applying the reverse bias to the gate to source junction the FET is turned off. It is noticed in this case, however, there is no saturation mechanism, therefore the combination of FET F8 and transistor Q3 never saturates. Transistor Q3, the bipolar transistor, never goes into saturation; it's an emitter follower. The FET F8 never goes into saturation since the FET is a majority carrier device. Therefore, there is no charge storage in the combination of the FET F8 and the transistor Q3 and as a result no limitation to the speed of the device.

The base of Q3 contains the three elements: transistor Q4, Zener diode D2 and FET F9. FET F9 supplies a constant current source for the input $\overline{II}$ so that the pull up occurs along a current source which is a fast pull up mode and also a fast discharge mode since FET F9 acts as a constant current source. Diode D2 and transistor Q4 serve as two different forms of voltage limiting, transistor Q4 being an emitter collector punch through transistor with the emitter and collector very close together. Therefore, the collector punches through the base to the emitter to get a desired voltage characteristic. D2 is a conventional Zener diode. The particular one of these two devices which limits the voltage first is determined by the pinch off voltage of the FETs in the circuit. Since it may be one or the other, both are in the circuit to assure a maximum limiting voltage, or a limiting voltage which is proportional to the pinch off voltage, whichever is less. Thus, by virtue of Q4 and D2, the voltage swing at the base of Q3 is limited. Therefore there is a minimum number of volts to discharge in terms of the capacitance on the base and, with this minimum discharge range, the circuit operation is speeded up.

This combination of the FET F8 and the transistor Q3 has rather unique properties independent of the present circuit in which it is utilized, since Q3 is first of all an emitter follower transistor, with an extremely high beta. This makes a unique transistor structure possible with the fabrication of the FET using well known processes, the transistor being made at the same time as the field effect transistor is made. The combination of the two structures, i.e., the transistor Q3 and the FET F8, provides very good RF properties and very good switching properties. In the particular circuit of FIG. 2, this novel combination results in an extremely fast discharge of the gate of FET F3 and, in fact, an extremely fast discharge of the buss coupled to the gate of F3 including F1 and Q2. This results in pulling the gate of F3 down to a point of about 0.6 volts from the negative supply at a very rapid rate. It has the additional advantage that when the gate of F3 is moved up towards the positive supply, i.e., up towards the source of F3, via the loop discussed herein, the combination of Q3 and F8 have no stored charge to remove such as a bipolar transistor would and therefore the turn off delay time is negligible.

Referring now to FIG. 3 there is shown a cross section of the construction of a typical form of combination transistor Q3 and FET F8. This structure is made in accordance with standard IC fabrication techniques and comprises a P substrate 11 with an N-epitaxial layer grown thereon, the P substrate being provided with P+ isolation regions 13 separating the transistor Q3 area from the FET F8 area.

The transistor Q3 comprises a P type emitter diffusion 14 encircled by an N type base diffusion 15 with the P substrate as the collector. The FET F8 is formed by an N diffusion source region 16 and an N diffusion drain region 17 separated by a P diffusion gate region 18 over the N-channel region. The P diffusion emitter region 14 of Q3 is interconnected by a surface connection 19 to the N type source region 16 of the FET F8. External contact 21 and 22, respectively, are made for the base region 15 of the transistor Q3 and for the drain region 17 of the FET F8. The collector for the transistor and the gate region for the FET are coupled together in the P substrate region. The base region 15 of the transistor Q3 and the source and drain regions 16 and 17 of the FET F8 are formed during the same diffusion. The emitter region 14 of the transistor Q3 and the gate region 18 of the FET F8 are formed during the same P diffusion step of the process. It can thus be seen that this combination of the transistor Q3 and the FET F8 can be easily fabricated simultaneously utilizing standard integrated circuit fabrication techniques.

What is claimed is:

1. A combination transistor structure and FET structure on the same substrate comprising:

a substrate of a first conductivity type material, an epitaxial layer of a second conductivity type material grown on said substrate, isolation regions of said first conductivity type dividing the structure into isolated areas and extending into said substrate, a transistor formed in a first area wherein said substrate serves as the collector comprising, an emitter of said first conductivity type diffused into said epitaxial layer, and a base region of said second conductivity type diffused into said epitaxial layer separated from said emitter, said base being diffused at a higher concentration than said epitaxial layer, a field effect transistor formed in a second area comprising, a gate region of said first conductivity type diffused into said epitaxial layer and extending to said isolation region, and a source and a drain region of said second conductivity type diffused into said epitaxial layer on either side of said region, said source and drain regions being diffused at a higher concentration than said epitaxial layer, electrical conductor means interconnecting said emitter region and said source region, the collector of said transistor connected to the channel region under said gate by means of said substrate, and external contacts for said transistor base region and for said FET drain region.

* * * * *